US009276154B2

(12) United States Patent
Damjanovic et al.

(10) Patent No.: US 9,276,154 B2
(45) Date of Patent: Mar. 1, 2016

(54) PHOTOVOLTAIC DEVICE WITH PROTECTIVE LAYER OVER A WINDOW LAYER AND METHOD OF MANUFACTURE OF THE SAME

(71) Applicant: FIRST SOLAR, INC., Perrysburg, OH (US)

(72) Inventors: Daniel Damjanovic, Perrysburg, OH (US); Jing Guo, Sunnyvale, CA (US); Sreenivas Jayaraman, Perrysburg, OH (US); Oleh P. Karpenko, Richmond, CA (US); Feng Liao, Perrysburg, OH (US); Chong Lim, Holland, OH (US); Rick C. Powell, Ann Arbor, MI (US); Jigish Trivedi, Perrysburg, OH (US); Zhibo Zhao, Novi, MI (US)

(73) Assignee: FIRST SOLAR, INC., Perrysburg, OH (US)

( * ) Notice: Subject to any disclaimer, the term of this patent is extended or adjusted under 35 U.S.C. 154(b) by 0 days.

(21) Appl. No.: 14/170,989

(22) Filed: Feb. 3, 2014

(65) Prior Publication Data

US 2014/0216535 A1 Aug. 7, 2014

Related U.S. Application Data

(60) Provisional application No. 61/762,014, filed on Feb. 7, 2013.

(51) Int. Cl.
| H01L 21/00 | (2006.01) |
| H01L 31/00 | (2006.01) |
| H01L 31/065 | (2012.01) |
| H01L 31/18 | (2006.01) |
| H01L 31/0216 | (2014.01) |

(Continued)

(52) U.S. Cl.
CPC ........ *H01L 31/065* (2013.01); *H01L 31/02167* (2013.01); *H01L 31/073* (2013.01); *H01L 31/1828* (2013.01); *H01L 31/1864* (2013.01); *H01L 31/1872* (2013.01); *H01L 31/03925* (2013.01); *Y02E 10/543* (2013.01)

(58) Field of Classification Search
USPC ........ 136/243–265; 438/57–98; 257/431–466
See application file for complete search history.

(56) References Cited

U.S. PATENT DOCUMENTS

| 5,501,744 A | 3/1996 | Albright et al. |
| 7,235,736 B1 | 6/2007 | Buller et al. |

(Continued)

FOREIGN PATENT DOCUMENTS

| EP | 2 535 941 A2 | 12/2012 |
| WO | WO/2011017479 | 2/2011 |

(Continued)

OTHER PUBLICATIONS

Perrenoud et al., "Application of $ZNO_{1-x}S_x$ As Window Layer in Cadmium Telluride Solar Cells", 2010 IEEE.

(Continued)

*Primary Examiner* — Karen Kusumakar
(74) *Attorney, Agent, or Firm* — Dickstein Shapiro LLP (57) ABSTRACT

A photovoltaic device including a protective layer between a window layer and an absorber layer, the protective layer inhibiting dissolving/intermixing of the window layer into the absorber layer during a device activation step, and methods of forming such photovoltaic devices.

17 Claims, 3 Drawing Sheets

(51) Int. Cl.
*H01L 31/073* (2012.01)
*H01L 31/0392* (2006.01)

(56) References Cited

U.S. PATENT DOCUMENTS

| | | |
|---|---|---|
| 7,732,229 B2 | 6/2010 | Leidholm et al. |
| 7,939,363 B1 * | 5/2011 | Johnson et al. ............... 438/87 |
| 7,968,869 B2 | 6/2011 | Sheats et al. |
| 8,039,739 B1 | 10/2011 | Capps et al. |
| 8,088,309 B2 | 1/2012 | Yu et al. |
| 2003/0041894 A1 * | 3/2003 | Sverdrup et al. ............. 136/251 |
| 2007/0295388 A1 | 12/2007 | Adriani et al. |
| 2008/0318034 A1 | 12/2008 | Murakami et al. |
| 2009/0211637 A1 | 8/2009 | Eaglesham |
| 2009/0235986 A1 * | 9/2009 | Hotz et al. ................... 136/260 |
| 2009/0242029 A1 * | 10/2009 | Paulson et al. ............... 136/260 |
| 2010/0059112 A1 | 3/2010 | Gupta et al. |
| 2010/0132765 A1 | 6/2010 | Cumpston et al. |
| 2010/0180935 A1 | 7/2010 | Chen |
| 2010/0197068 A1 | 8/2010 | Poon et al. |
| 2010/0282320 A1 | 11/2010 | Meyers et al. |
| 2010/0319757 A1 | 12/2010 | Oetting |
| 2011/0005594 A1 * | 1/2011 | Powell et al. ................. 136/258 |
| 2011/0100460 A1 * | 5/2011 | Bryden et al. ................ 136/260 |
| 2011/0214725 A1 * | 9/2011 | Beck ............................. 136/255 |
| 2011/0220198 A1 * | 9/2011 | Tandon et al. ................ 136/256 |
| 2011/0247687 A1 * | 10/2011 | Zhang et al. .................. 136/256 |
| 2011/0265865 A1 | 11/2011 | Korevaar |
| 2011/0290308 A1 | 12/2011 | Korevaar |
| 2011/0290654 A1 | 12/2011 | Weiner et al. |
| 2012/0024380 A1 | 2/2012 | Feldman-Peabody et al. |
| 2012/0318352 A1 * | 12/2012 | Korevaar ...................... 136/259 |

FOREIGN PATENT DOCUMENTS

| | | |
|---|---|---|
| WO | WO/2011/028513 | 3/2011 |
| WO | WO/2011077008 | 6/2011 |
| WO | WO/2011126454 | 10/2011 |

OTHER PUBLICATIONS

Chopra et al., "Thin-Film Solar Cells: An Overview", Progress in Photovoltaics: Research and Applications, Prog. Photovolt: Res. Appl. 2004.

* cited by examiner

PHOTOVOLTAIC DEVICE WITH PROTECTIVE LAYER OVER A WINDOW LAYER AND METHOD OF MANUFACTURE OF THE SAME

CROSS-REFERENCE TO RELATED APPLICATION

This application claims priority to U.S. Provisional Application No. 61/762,014, filed Feb. 7, 2013, which is hereby fully incorporated by reference.

TECHNICAL FIELD

This disclosure relates generally to photovoltaic (PV) devices, which include photovoltaic cells and photovoltaic modules containing photovoltaic cells, and more specifically, to PV devices incorporating a protective layer between a window layer and an absorber layer thereof in order to inhibit dissolving/intermixing of the window layer into the absorber layer, and methods for manufacturing such devices.

BACKGROUND

PV devices convert photo-radiation into electrical current. Generally, a thin film PV device includes two conductive electrodes sandwiching a series of semiconductor layers. The semiconductor layers include an n-type window layer and a p-type absorber layer providing a p-n junction, near which photo-conversion occurs. During operation, photons pass through the window layer and are absorbed by the absorber layer. This produces photo-generated electron-hole pairs, the movement of which, promoted by a built-in electric field, produces electric current that can be output to other electrical devices.

A thin film PV device typically has an optically transparent substrate. This substrate can be any suitable, transparent substrate material. Suitable materials include glass, such as soda-lime glass or float glass, etc., and polymer (sheet or plates). A first of two conductive electrodes is provided over the transparent substrate. This first conductive electrode can, in some instances, be just a transparent conductive oxide (TCO) layer (e.g., indium tin oxide, cadmium stannate, $SnO_2$:F, or other transparent, conductive materials). In other instances, this first conductive electrode can be a TCO layer that is associated with a barrier layer (e.g., $SiO_2$, $SnO_2$ or a layered sequence of the two) between it and the transparent substrate for preventing diffusion of sodium from the substrate into other layers of the device, and an optional buffer layer (e.g., a metal oxide such as $SnO_2$, ZnO, or ZnO:$SnO_2$) over the TCO layer for providing a smooth surface upon which subsequently formed semiconductor layers may be deposited. The barrier, TCO and buffer layers are often referred to as a TCO stack since they may first be formed and then deposited unto the substrate as a stack.

The semiconductor layers can be a bi-layer that includes the n-type semiconductor window layer and the p-type semiconductor layer. The n-type semiconductor layer can be made of various semiconductor materials including, but not limited to, cadmium sulfide (CdS). The p-type semiconductor absorber layer can also be made of various semiconductor materials, including, but not limited to, cadmium telluride (CdTe). In some devices, the window layer is desired to be as thin as possible so as to allow the maximum amount of light to reach the absorber layer, but still be sufficiently thick so as to maintain a consistent junction with the absorber layer. Over the semiconductor bi-layer, the second of the two conductive electrodes may be provided. This second electrode is usually referred to as a back contact layer, which is generally made of a metal or alloy (e.g., Mo, Al, Cu, Ag, Au, or combinations of these).

A back cover can be provided over the back contact layer to provide, together with the substrate, support for the PV device. An interlayer (e.g., a polymer) can be provided between the back contact layer and the back cover and over the sides of the other layers of the PV device to seal the PV device from the environment. Such a PV device can be fabricated beginning with the substrate and subsequently depositing or providing the other layers in sequence, or it can be fabricated beginning with the back cover and proceeding with depositing or providing the other layers in the reverse order.

During the manufacture of conventional PV devices having a CdTe-based absorber layer and a CdS-based window layer, a chloride activation process is typically employed to improve efficiency and to reduce electrical anomalies. Such an activation process provides grain growth and repairs (or passivates) defects in the CdTe absorber layer by incorporation of Cl atoms (or ions) into the absorber layer. As discussed below, grain growth and defect repair improves device efficiency by increasing photocurrent and open-circuit voltage ($V_{oc}$—one of the factors contributing to PV device efficiency and a measure of the maximum voltage the device can produce) and reducing shunting (i.e., unwanted electrically conductive regions in the absorber layer material due to compositional inconsistencies). Efficiency, in this instance, refers to the electrical power (energy) generated by the PV device compared to the equivalent energy of photons incident on the device.

Typically, the activation process includes a first step in which chlorine is introduced to the semiconductor layers, and a second step in which the semiconductor layers are annealed at an elevated temperature for a particular length of time. To introduce the chlorine to the semiconductor layers, $CdCl_2$, for example, may be applied as an aqueous solution ($CdCl_2$ is soluble in water) at a concentration of about 100-300 g/L. It is also possible to use other chlorine-doping materials as alternatives to $CdCl_2$, such as $MnCl_2$, $ZnCl_2$, $NHCl_4$, $TeCl_2$ and $MgCl_2$, for example. For example, the annealing temperature can be about 350°-450° C. and applied for about 60 minutes, with a soaking time of about 15 minutes. Soaking time refers to the time period where the annealing step plateaus at a maximum desired temperature.

Grain growth of the CdTe material occurs as the activation step enlarges the grains, or crystallites, of the CdTe material of the absorber layer. Typically after the CdTe material for the absorber layer is deposited over the CdS material of the window layer, the CdTe material is composed of separate crystallites of CdTe smaller than a micron in size. The activation step promotes recrystallization and grain growth of these crystals, which changes the morphology of the absorber layer. The recrystallization of the CdTe material can take two forms: (1) intragrain, or primary, recrystallization that changes grain orientation and (2) intergrain, or secondary, recrystallization resulting from grain coalescence. This recrystallization, particularly the intergrain type, results in grain growth and larger crystallites of CdTe. Both forms of recrystallization reduce the resistivity of the CdTe material and, by creating acceptor states caused by the incorporation of Cl, make the absorber layer material more p-type, which improves the p-n junction for photoconversion.

As mentioned above, the activation step can provide defect repair (passivation) of the absorber layer, which refers to mitigating photocurrent loss due to, for example, chemical impurities, vacancies, and chemical substitutions, particularly at the grain boundaries in the absorber layer material. Imperfections or defects disrupt the periodic structure in the absorber layer and can create areas of high resistance or current loss. During the $CdCl_2$ anneal of the activation step, the CdS material of the window layer tends to dissolve into and intermix with CdTe of the absorber layer, which makes the CdS window layer have a non-uniform thickness or in some cases it may become discontinuous. This can cause device performance degradation. It would be desirable to use more chlorine-containing dopant, higher annealing temperatures, and/or longer anneal duration in an activation step to more aggressively treat the absorber layer, as this would increase the benefits conferred on the absorber layer by the activation step. However, using more aggressive process conditions during the activation step can cause further dissolving/intermixing of the CdS material (e.g., increased CdS/CdTe intermixing), thus further degrading or destroying the window layer, which causes more degradation in device performance.

An apparent solution to this problem would appear to be to simply increase the initial thickness of the CdS window layer so that if, and when, some of the CdS material is dissolved during the activation step, enough CdS material remains to maintain a good junction. This apparent remedy, however, causes other problems. CdS is relatively light absorbent and having a thicker CdS window layer after the activation step reduces the available light for photon harvesting at the absorber layer, thereby reducing photovoltaic efficiency. In general, it is desired to have a very thin CdS window layer to provide better light transmission to the absorber layer.

A PV device incorporating an absorber layer that can be activated with an aggressive activation step while maintaining the integrity of a thin CdS window layer is desired, as is a method of making such a PV device.

DETAILED DESCRIPTION

Embodiments described herein provide a PV device having a window layer, e.g., a CdS window layer, a protective layer over the window layer, and an absorber layer, e.g., a CdTe absorber layer, over the protective layer, as well as methods of forming such a PV device, are disclosed. The protective layer acts to inhibit the dissolving/intermixing of CdS material of the window layer during the activation step, thereby allowing the PV device to have and maintain a thin window layer while also allowing for an aggressive activation of the absorber layer. The imposition of the protective layer between the window layer and absorber layer does not destroy the p-n junction for photoconversion, in part, because the protective layer may be very thin, for example, less than about 10 nm thick in some embodiments, and also because the protective layer may be considered an extension of the absorber layer, thereby simply extending the absorber layer interface to the window layer below the protective layer.

Figure 1:
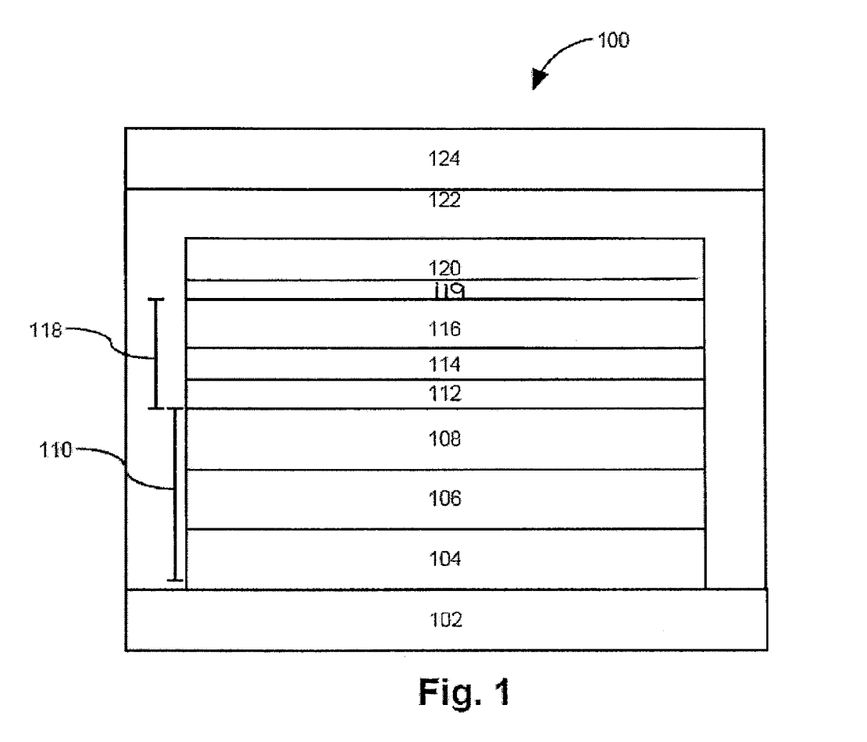
FIG. 1 shows a portion of a PV device in accordance with a disclosed embodiment.

Now referring to the accompanying figures, where like reference numbers denote like features, FIG. 1 shows a PV device of an exemplary embodiment. For exemplary purposes, the PV device will be described in relation to a PV module 100; however, the disclosed PV device may include a photovoltaic cell, collection of cells, module, device, or any portion or combination thereof.

The PV module 100 includes a transparent substrate 102, which can be glass or another suitable material. Over the transparent substrate 102 is a TCO contact stack 110. The TCO contact stack 110 may include a barrier layer 104 (e.g., $SnO_2$, $SiO_2$, or a layered sequence of the two) over the substrate 102. The TCO contact stack 110 may also include a conductive TCO layer 106 (e.g., ITO, cadmium stannate, or $SnO_2$:F) over the barrier layer 104. The TCO contact stack 110 may also include a buffer layer 108 (e.g., a metal oxide such as $SnO_2$, ZnO, or $ZnO:SnO_2$) over the TCO layer 106. These layers 104, 106, 108 are in contact with one another. Over the TCO contact stack 110, a semiconductor multi-layer 118 is provided.

The semiconductor multi-layer 118 includes a window layer 112, e.g., CdS, a protective layer 114 over the window layer 112, and an absorber layer 116, e.g., CdTe, over the protective layer 114. The window layer 112 is in contact with the buffer layer 108 and the layers of the semiconductor multi-layer 112, 114, 116 are in contact with one another. Particular materials for the protective layer 114 are discussed in detail below. A back contact layer 120 (e.g., typically formed of Mo, Al, Cu, Ag, Au, or combinations of these) is over the absorber layer 116. An interlayer 122 (e.g., a polymer) can be provided over the back contact layer 120 and the sides of the layers (110, 116, 120) of the PV module 100, between a back cover 124 and the transparent substrate 102.

Inclusion of the protective layer 114 in PV module 100 acts to protect the window layer 112 during the activation step and prevents the CdS material of the window layer 112 from excessively dissolving into/intermixing with the absorber layer 116. As a result, it is possible to use more aggressive activation conditions (e.g., more $CdCl_2$ dopant and/or higher annealing temperatures and/or longer annealing durations) to create a superior CdTe absorber layer 116 without impacting the integrity of the CdS material of the window layer 112. For example, when the protective layer 114 is included, a higher temperature anneal of up to about 485° C. for a $CdCl_2$ activation can be used (with or without a corresponding shortened anneal time) or the duration of the anneal can be lengthened (with or without a corresponding temperature increase).

As one example, the protective layer 114 of the PV module 100 of FIG. 1 may be a dielectric material and can be formed of, for example, zinc oxide (ZnO), zinc sulfide (ZnS), zinc oxygen sulfide (Zn(O,S) or ZnO:ZnS, which are synonymous), a silicon oxide (e.g., $SiO_2$), a titanium oxide (e.g., $TiO_2$), or tantalum pentoxide ($Ta_2O_5$); however, it is not limited to these materials and may be formed of any dielectric material having good charge tunneling characteristics. As a specific example, the protective layer 114 may be formed of ZnO, ZnS, or Zn(O,S) having a thickness of about 10 nm or less.

In one specific exemplary embodiment, the PV module 100 includes a substrate 102 and a TCO stack 110, which can be provided as a commercially available TEC10 substrate. A TEC 10 substrate includes $SnO_2$:F as the TCO layer 106 over float glass (as substrate 102) and has a resistivity of 10 $\Omega/m^2$. Over the TCO stack 110, the PV module 100 further includes a window layer 112, e.g., CdS, that is up to about 100 nm thick, preferably between about 10 nm and 40 nm, and most preferably about 30 nm thick, a Zn(O,S) protective layer 114 that is up to about 10 nm thick, an absorber layer 116, e.g., CdTe, that is about 2000-8000 nm thick, and a back contact layer 120. The back contact layer 120 may be a multilayered structure, including, for example, a molybdenum nitride layer that is about 10-100 nm thick, an aluminum layer that is about 50-600 nm thick and a chromium layer that is about 10-100 nm thick. Optionally, an intermediate layer 119 that includes ZnTe layer that is about 10-200 nm thick may be provided between the absorber layer 116 and the back contact layer 120, for reducing ohmic resistance to charge flow. An interlayer 122 and back cover 124 as known in the art can also be included in this exemplary embodiment.

In this example, the dielectric protective layer 114 is preferably formed using atomic layer deposition (ALD). ALD is a well understood and widely used thin film deposition technique that is based on the sequential use of a gas phase chemical process. ALD reactions typically use two chemicals, called precursors, which react with a surface, one-at-a-time in a repeated and sequential manner to deposit a thin film on that surface. For example, diethyl-zinc (($C_2H_5$)$_2$Zn, also called DEZn) may be used as the zinc precursor, either with water ($H_2O$) as a reactant gas to produce ZnO or with $H_2S$ as a reactant gas to produce ZnS. In some ALD processes, an additional precursor may be introduced to form a ternary film (e.g., Zn(O,S) or ZnO:ZnS). For example, DEZn can be used as a precursor for zinc with $H_2O$ and $H_2S$ serving as the reactant gas (in an alternating manner) to result in the formation of ZnO and ZnS, respectively. Alternating the gas reactants while using a DEZn precursor builds a ternary alloy Zn(O,S) protective layer 114. Regardless of the selected material for the protective layer 114, it is deposited one atomic layer at a time, until the desired thickness of the protective layer 114 is achieved, e.g., up to about 10 nm. During this ALD process, the deposition temperature is preferably kept to less than 300° C., or to less than 150° C.

There are several reasons why an ALD process is preferred. Compared to other common deposition methods, such as chemical vapor deposition (CVD) or atmospheric pressure chemical vapor deposition (APCVD), which typically take place at temperatures above 300° C., ALD allows for the deposition of the protective layer 114 at lower temperatures. High temperatures during deposition of the protective layer 114 could adversely affect the integrity of the CdS window layer 112, for example, by causing dissolving of the CdS material, much like the dissolving/intermixing that can occur during an activation step. Once the protective layer 114 is in place, this dissolving/intermixing is prevented, as discussed above.

Also, ALD allows a high level of control over film thickness and results in a very uniform film. This is important because it allows for the protective layer 114 to be formed to the thin dimensions discussed for the dielectric protective layer 114 and also for its thickness to be consistent and uniform.

ALD also provides conformal layer deposition. Because the TCO stack 110 and the CdS window layer 112 may be somewhat rough in texture, use of ALD to form the protective layer 114 prevents forming an even rougher surface for deposition of the absorber layer 116. Hence, by adding the ALD protective layer 114 (rather than a protective layer formed by other methods), the interface between the protective layer 114 and the window layer 112, and the protective layer 114 and the absorber layer 116, should not differ in terms of roughness from the interface between the window layer 112 and the absorber layer 116 in a structure where no protective layer 114 is used.

Finally, in the case of depositing ternary alloys such as Zn(O,S) (e.g., as the protective layer 114), ALD allows for a high level of control over the stoichiometry of the material by the dosing of the precursor reactant gas. By controlling the stoichiometry of the deposited material, a high level of control can be exerted over the basic material properties of this material, such as optical band gap (the energy required to free an outer shell electron from its orbit about the nucleus of an atom to become a mobile charge carrier, which determines what portion of the solar spectrum a PV device absorbs and can be harvested) and sheet resistance (the measure of resistance of thin films of nominally uniform thickness and quality control parameter of a solar cell), both of which can effect overall PV device performance.

As another example, the protective layer 114 of the PV module 100 of FIG. 1 may be a layer formed of the same material as window layer 112, e.g., CdS, having finer grains (e.g., a smaller grain size) than those in the window layer 112. This finer-grain protective layer 114 is formed on the window layer 112 and provides a more uniform and consistent layer for absorber layer, e.g., CdTe, deposition. During the $CdCl_2$ activation step, this finer-grain protective layer 114 will be more-easily diffused (than the larger-grain window layer 112) into the absorber layer 116, thus protecting the larger-grain window layer 112. For a CdS window layer 112 and a CdTe absorber layer 116, this diffusion will form a graded $CdS_xTe_{(1-x)}$ layer at the interface between the window layer 112 and the absorber layer 116, where 0<x<1, due to the dissolving/intermixing of CdS into the CdTe material. This graded $CdS_xTe_{(1-x)}$ layer provides a high quality metallurgical and electrical junction between the window layer 112 and the absorber layer 116, while at the same time allowing a high quality, thin and continuous window layer 112 to be maintained. The graded $CdS_xTe_{(1-x)}$ layer may have a thickness between 10-50 nm.

In this example, the finer-grain CdS protective layer 114 can be formed by varying the deposition conditions for depositing the CdS for the protective layer 114, as compared to those used for forming the window layer 112. Deposition conditions which can affect the grain size of the resulting layer include substrate temperature during deposition, ambient pressure, and the CdS powder to helium gas ratio used for deposition. For example, a lower substrate temperature and higher ambient pressure can be used for the protective layer 114 deposition, compared to the temperature and pressure used for window layer 112, thus leading to smaller grain size in the protective layer 114.

In other exemplary embodiments, the protective layer 114 of the PV module 100 of FIG. 1 may be formed of one or more of CdSe, $Cu_2S$, $Cu_2O$, GaP, $As_2Se_3$, Se or $Zn_3P_2$. For these materials, the protective layer 114 may be formed by any well-known deposition method, such as vapor transport deposition (VTD). During the activation step, for a CdSe, GaP, $As_2Se_3$, Se or $Zn_3P_2$ protective layer 114, the protective layer 114 may diffuse into the CdTe absorber layer 116, thereby forming a graded $CdS_xTe_yA_z$ layer at the interface between the window layer 112 and the absorber layer 116, where the A is one of As, P or Se and where 0<x<1, 0<y<1, 0<z<1. The graded $CdS_xTe_yA_z$ layer has an energy band-gap between that of the CdS window layer 112 (2.4 eV) and the CdTe absorber layer 116 (1.48 eV). Alternatively, for a $Cu_2S$ or $Cu_2O$ protective layer 114, the protective layer 114 does not diffuse significantly during the activation step, and the $Cu_2S$ or $Cu_2O$ compound itself has an energy band-gap between that of the CdS window layer 112 (2.4 eV) and the CdTe absorber layer 116 (1.48 eV).

Figure 2:
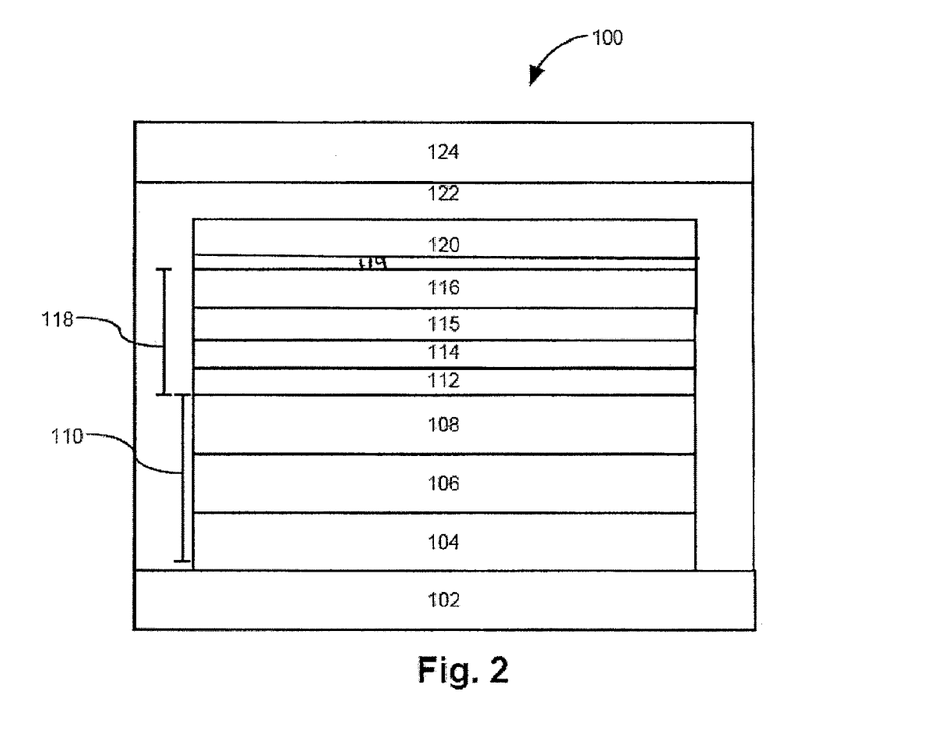
FIG. 2 shows a portion of a PV device in accordance with a disclosed embodiment.

FIG. 2 shows another exemplary embodiment including a PV module 100 with similar layers (e.g., 102, 110, 112, 114, 116, 120, 122, 124) to those discussed above in reference to FIG. 1. In the embodiment of FIG. 2, the protective layer 114 is preferably one of the zinc-containing dielectric protective layers (e.g., ZnO, ZnS or Zn(O,S)), such as those described as the first example with respect to FIG. 1 above. A zinc-containing intermediate layer 115 is provided between the protective layer 114 and the absorber layer 116. The zinc-containing intermediate layer 115 further is preferably about 1 nm to about 100 nm thick. The addition of the zinc-containing intermediate layer 115 to the PV module 100 creates a graded absorber layer 116 because it provides a transition between the zinc-containing protective layer 114 and the CdTe-containing absorber layer 116. The zinc-containing intermediate layer 115 may include ZnTe. The diffusion of zinc from the zinc-containing intermediate layer 115 into the absorber layer 116 during the activation step, creates a zinc gradient in the absorber layer 116 with the amount of zinc in absorber layer 116 being greater closer to the interface of layers 115 and 116. Further, by providing a source of zinc for the absorber layer 116, the zinc-containing intermediate layer 115 can raise the band gap of the absorber layer 116, which can provide a better p-n junction by making the CdTe of the absorber layer 116 more p-type.

When used with the zinc-containing dielectric protective layer 114, the zinc-containing intermediate layer 115 can also improve lattice mismatch between the protective layer 114 and the absorber layer 116. Lattice mismatch occurs when adjacent materials have different lattice configurations. That is, each has a different distance between unit cells in its crystal lattice. The smaller the lattice mismatch between the window and absorber layers of a PV device, the higher the conversion efficiency due to fewer electron-hole recombinations which can occur at lattice mismatch locations, which in turn reduces current loss and improves current flow in the device. In this embodiment, zinc-containing intermediate layer 115 has a smaller lattice mismatch between it and the zinc-containing dielectric protective layer 114 and between it and CdTe absorber layer 116 than occurs at a junction between the zinc-containing dielectric protective layer 114 and the CdTe absorber layer 116.

The PV module 100 shown in FIG. 2 can be formed in steps similar to those used to form the exemplary structure of FIG. 1, can have component dimensions (other than the differences identified above) similar to the exemplary structure of FIG. 1, and can provide efficiency benefits similar to those achieved with the exemplary structure shown in FIG. 1. The added zinc-containing intermediate layer 115 can be formed by ALD, as with the zinc-containing dielectric protective layer 114, or other known techniques can be used.

With each of the disclosed embodiments described above, a multi-step activation process may be used instead of a single activation step. Since each desired activation mechanism (e.g., CdTe grain growth, chlorine diffusion, and sulfur interdiffusion into the CdTe) requires a different thermal activation energy, using a multi-step process allows each to be optimized and precisely controlled. In other words, the finished device characteristics of the device after the activation step (which determine the efficiency of the device), are affected by the anneal conditions, including, for example, max anneal temperature, the ramping speed and/or the time spent at the anneal temperature.

The multi-step activation process may include multiple annealing steps. For example, a single $CdCl_2$ application can be employed and paired with annealing using a multi-step temperature profile. In one specific example, the anneal temperature may be first ramped up to a first (relatively lower) temperature and held there for a first period of time and then ramped up again to a second (relatively higher) temperature and held there for a second period of time before ramping the anneal temperature back down. This temperature profile for the anneal results in different device crystallinity characteristics than either of a device activated with a single anneal at the first temperature or a device activated with a single anneal at the second temperature. Alternatively, multiple $CdCl_2$ applications, each paired with annealing at varied times and temperatures may be used.

Other temperature-time combinations for the multi-step activation process may be determined by one of skill in the art based on the particular choice of materials. These variations on the activation step can further optimize device performance, as measured by device efficiency. The multi-step activation approach can also improve yield of glass substrate based devices, as compared to using a conventional single, high-temperature activation step. This is due to lowered thermal stress on the glass substrate caused by the more gradual temperature ramp up process.

The above-described advantages relating to the provision of the protective layer 114 in the PV module 100 are exemplary and non-limiting. Other advantages may be realized and the invention should not be limited to or by those discussed above.

In each of the embodiments of FIGS. 1 and 2, some layers illustrated may be omitted and, if desired, the interlayer 122 may be provided only on the sides of the other material layers and not between the back contact 120 and the back cover 124. Also, each layer described herein may include more than one layer or film and each layer can cover all or a portion of the device and/or all or a portion of the underlying material. For example, a "layer" can include any amount of any material that contacts all or a portion of a surface. Also, layers described as "over" another layer may be preferably in contact with such underlying layer, but are not necessarily so, unless otherwise indicated, and there may be intervening layers. Further, it is also possible for some of the disclosed layers to be consumed or for distinct boundaries between disclosed layers to be lost during subsequent manufacturing steps.

Figure 3:
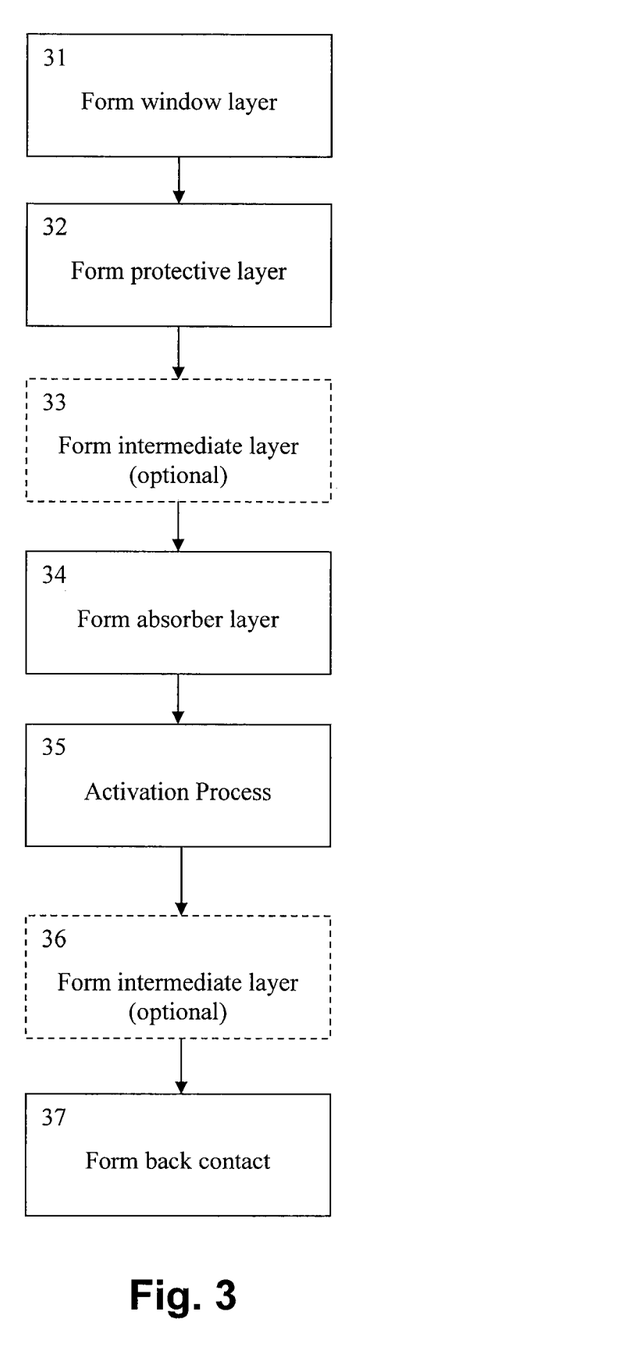
FIG. 3 is a flow chart of a method of forming a photovoltaic device in accordance with the exemplary embodiments.

FIG. 3 is a flow chart of a method of forming a photovoltaic device in accordance with the exemplary embodiments. In step 31, a window layer 112 is formed. As described above, the window layer 112 may be formed over a substrate 102 upon which TCO stack 110 has been deposited. In step 32, a protective layer 114 is formed. This protective layer 114 may be any of the protective layers 114 described above with respect to FIGS. 1 and 2. In optional step 33, an intermediate layer 115 (as described above with respect to FIG. 2) may be formed. In step 34, an absorber layer 116 is formed over the protective layer 114 (or over intermediate layer 115, if present). In Step 35, an activation process is performed on the stack which includes substrate 102, TCO stack 110, window layer 112, protective layer 114, optional intermediate layer 115, and absorber layer 116. As described above, the protective layer 114 inhibits dissolving/intermixing of the window layer 112 into the absorber layer 116 during the activation process. The details of the activation process (e.g., temperature profiles, soaking times) is discussed above. In optional step 36, an intermediate layer 119 (as described above with respect to FIGS. 1 and 2) may be formed. In step 37, back contact 120 is formed over absorber layer 116 (or over optional intermediate layer 119, if present).

Although a number of embodiments have been described, it will be understood that various modifications can be made without departing from the scope of the invention. Also, it should also be understood that the appended drawings are not necessarily to scale, presenting a somewhat simplified representation of various features and basic principles of the invention. The invention is not intended to be limited by any portion of the disclosure and is defined only by the appended claims.

What is claimed is:

1. A photovoltaic device, comprising:
    a window layer;
    an absorber layer; and
    a protective layer between the window layer and the absorber layer which inhibits movement of the window layer into the absorber layer during device processing; and
    an intermediate layer formed between the protective layer and absorber layer,
    wherein the protective layer comprises Zn, the absorber layer comprises Cd, and the intermediate layer comprises Zn and Cd.

2. A photovoltaic device, comprising:
    a window layer;
    an absorber layer;
    a protective layer between the window layer and the absorber layer which inhibits movement of the window layer into the absorber layer during device processing; and
    an intermediate layer formed between the protective layer and absorber layer,
    wherein the protective layer comprises ZnO: ZnS, the absorber layer comprises CdTe, and the intermediate layer comprises ZnTe.

3. A photovoltaic device, comprising:
    a window layer;
    an absorber layer; and
    a protective layer between the window layer and the absorber layer which inhibits movement of the window layer into the absorber layer during device processing,
    wherein the window layer comprises CdS and the absorber layer comprises CdTe, and
    wherein the protective layer comprises a material selected from the group consisting of $Cu_2S$ and $Cu_2O$.

4. The photovoltaic device of claim 3, wherein the window layer has a thickness of between about 10 nm and about 40 nm.

5. A photovoltaic device, comprising:
    a window layer;
    an absorber layer; and
    a protective layer between the window layer and the absorber layer which inhibits movement of the window layer into the absorber layer during device processing,
    wherein the window layer comprises CdS and the absorber layer comprises CdTe, and wherein a graded $CdS_xTe_yA_z$ layer ($0<x<1, 0<y<1, 0<z<1$) is formed between the window layer and absorber layer, wherein A is one of As, P or Se.

6. The photovoltaic device of claim 5, wherein the graded $CdS_xTe_yA_z$ layer is formed from a material selected from the group consisting of CdSe, GaP, $As_2Se_3$, Se and $Zn_3P_2$ which diffuses into the absorber layer during device processing.

7. The photovoltaic device of claim 5, wherein the graded $CdS_xTe_yA_z$ layer has an energy band-gap between those of the window layer and the absorber layer.

8. The photovoltaic device of claim 5, wherein the window layer has a thickness of between about 10 nm and about 40 nm.

9. A method of forming a photovoltaic device, comprising:
    forming a window layer;
    forming an absorber layer;
    forming a protective layer between the window layer and the absorber layer; and
    activating the absorber layer,
    wherein the protective layer inhibits intermixing of the window layer into the absorber layer during the activation and comprises at least one of Zn, ZnO, ZnS, and ZnO:ZnS, the window layer comprises CdS, and the absorber layer comprises CdTe.

10. A method of forming a photovoltaic device, comprising:
    forming a window layer;
    forming an absorber layer;
    forming a protective layer between the window layer and the absorber layer; and
    activating the absorber layer,
    wherein the window layer comprises CdS, the absorber layer comprises CdTe, and the protective layer inhibits intermixing of the window layer into the absorber layer during the activation and comprises a material selected from the group consisting of $Cu_2S$ and $Cu_2O$.

11. The method of claim 10, wherein the window layer has a thickness of between about 10 nm and about 40 nm.

12. A method of forming a photovoltaic device, comprising:
    forming a window layer;
    forming an absorber layer;
    forming a protective layer between the window layer and the absorber layer; and
    activating the absorber layer,
    wherein the window layer comprises CdS, the absorber layer comprises CdTe, and the protective layer inhibits intermixing of the window layer into the absorber layer during the activation, comprises a material selected from the group consisting of CdSe, GaP, $As_2Se_3$, Se and $Zn_3P_2$, and diffuses into the absorber layer during the activation step, forming a graded $CdS_xTe_yA_z$ layer ($0<x<1, 0<y<1, 0<z<1$), wherein A is one of As, P or Se.

13. The method of claim 12, wherein the graded $CdS_xTe_yA_z$ layer has an energy band-gap between those of the window layer and the absorber layer.

14. The method of claim 12, wherein the window layer has a thickness of between about 10 nm and about 40 nm.

15. A method of forming a photovoltaic device, comprising:
    forming a window layer;
    forming an absorber layer;
    forming a protective layer between the window layer and the absorber layer;
    activating the absorber layer;
    forming an intermediate layer between the protective layer and the absorber layer,
    wherein the protective layer inhibits intermixing of the window layer into the absorber layer during the activation, comprises Zn, and has different material characteristics from the window layer, and wherein the absorber layer comprises Cd, and the intermediate layer comprises Zn and Cd.

16. A method of forming a photovoltaic device, comprising:
    forming a window layer;
    forming an absorber layer;
    forming a protective layer between the window layer and the absorber layer;
    activating the absorber layer;
    forming an intermediate layer between the protective layer and the absorber layer,
    wherein the protective layer inhibits intermixing of the window layer into the absorber layer during the activation, comprises ZnO:ZnS, and has different material characteristics from the window layer, and wherein the absorber layer comprises CdTe, and the intermediate layer comprises ZnTe.

17. A method of forming a photovoltaic device, comprising:
- forming a window layer;
- forming an absorber layer;
- forming a protective layer between the window layer and the absorber layer, the protective layer;
- activating the absorber layer; and
- forming an intermediate layer between the protective layer and the absorber layer,
- wherein the protective layer inhibits intermixing of the window layer into the absorber layer during the activation, comprises Zn and has different material characteristics from the window layer, and the intermediate layer comprises ZnTe.

* * * * *